(12) United States Patent
Shen

(10) Patent No.: US 6,380,613 B1
(45) Date of Patent: Apr. 30, 2002

(54) SEMICONDUCTOR DEVICE

(76) Inventor: Ming-Tung Shen, 4F, No. 52, Sec. 2, Chang Shan North Road, Taipei (TW)

( * ) Notice: Subject to any disclaimer, the term of this patent is extended or adjusted under 35 U.S.C. 154(b) by 0 days.

(21) Appl. No.: 09/478,823

(22) Filed: Jan. 6, 2000

(30) Foreign Application Priority Data

Oct. 6, 1999 (TW) ........................................ 88216939 U

(51) Int. Cl.$^7$ ............................ H01L 23/02; H01L 23/28
(52) U.S. Cl. ........................ 257/678; 257/787; 257/783
(58) Field of Search ................................ 257/698, 706, 257/707, 719; 438/122, 125, 787, 783, 777, 739, 723

(56) References Cited

U.S. PATENT DOCUMENTS

| | | | |
|---|---|---|---|
| 5,025,347 A | * | 6/1991 | Shindo et al. ............... 361/386 |
| 5,285,352 A | * | 2/1994 | Pastore et al. ............... 361/707 |
| 5,468,910 A | * | 11/1995 | Knapp et al. ............... 174/52.2 |
| 5,481,136 A | * | 1/1996 | Kohmoto et al. ........... 257/712 |
| 5,644,163 A | * | 7/1997 | Tsuji ........................... 257/706 |
| 6,051,450 A | * | 4/2000 | Ohsawa et al. ............. 438/123 |

* cited by examiner

Primary Examiner—Jhihan B. Clark
(74) Attorney, Agent, or Firm—Morgan & Finnegan, LLP

(57) ABSTRACT

A semiconductor device of the present invention comprises a mounting substrate, a supporting substrate, a die and a plurality of electrical conductors. The mounting substrate including a first surface and a second surface opposite to the first surface on which electrical traces are disposed is formed with a receiving hole passing through the first surface and the second surface. The supporting substrate is made of a metal material and the shape of the supporting substrate being accommodated to the receiving hole of the mounting substrate, the supporting substrate received in the receiving hole of the mounting substrate to form at least one die receiving cavity between peripheral wall confining the receiving hole of the mounting substrate and the supporting substrate. The die includes a pad mounting surface provided with a plurality of bonding pads and are received in the die receiving cavity. The electrical conductors are electrically connected the bonding pads of the die with corresponding the electrical trace on the first surface of the mounting substrate.

31 Claims, 4 Drawing Sheets

SEMICONDUCTOR DEVICE

BACKGROUND OF THIS INVENTION

1. Field of the Invention

The present invention relates to a semiconductor device, particularly to a conveniently manufactured semiconductor device.

2. Description of the Related Art

Currently, a semiconductor device combined with a substrate is commonly used. The manufacturing method in which a die is formed on a single side of a substrate is different from the manufacturing method in which dies are formed on two sides of a substrate. Therefore, it is necessary to prepare different substrates to meet different requirements, and more materials are needed to be stored, and more stock cost is raised.

SUMMARY OF THIS INVENTION

The object of the present invention is to provide a semiconductor device which is conveniently manufactured so as to overcome the aforementioned problems that are associated with the prior art.

In an aspect of the present invention, a semiconductor device of the present invention comprises a mounting substrate, a supporting substrate, a die and a plurality of electrical conductors. The mounting substrate includes a first surface on which predetermined electrical traces are disposed, and a second surface opposite to the first surface. The mounting substrate is formed with a receiving hole passing through the first surface and the second surface. The supporting substrate is made of a metal material and the shape of the supporting substrate is accommodated to the receiving hole of the mounting substrate. The supporting substrate is received in the receiving hole of the mounting substrate to form at least one die receiving cavity between peripheral wall that confines the receiving hole of the mounting substrate and the supporting substrate. The die includes a pad mounting surface provided with a plurality of bonding pads and are received in the die receiving cavity. The electrical conductors electrically connect the bonding pads of the die with the corresponding electrical traces on the first surface of the mounting substrate.

In another aspect of the present invention, a semiconductor device of the present invention comprises a mounting substrate, a supporting substrate, a die, a cover plate and a plurality of electrical conductors. The mounting substrate includes a first surface provided with predetermined electrical traces thereon, and a second surface opposite to the first surface. The mounting substrate is formed with a receiving hole passing through the first surface and the second surface. The supporting substrate is made of a metal material and the shape of the supporting substrate is accommodated to the receiving hole of the mounting substrate. The supporting substrate is received in the receiving hole of the mounting substrate to form at least one die receiving cavity between peripheral wall that confines the receiving hole of the mounting substrate and the supporting substrate. The die includes a pad mounting surface for mounting a plurality of bonding pads and is received in the die receiving cavity. The cover plate is received in the die receiving cavity over the die. The cover plate is formed with at least one access opening for exposing the pads of the die, and the cover plate has a surface which is exposed to the air and which is provided with predetermined electrical traces that are electrically connected with the corresponding electrical traces on the first surface of the mounting substrate. The electrical conductors are electrically connected the pads of the die with the corresponding electrical traces on the surface of the cover plate.

BRIEF DESCRIPTION OF THE DRAWINGS

The present invention will be described according to the accompanying drawings in which.

PREFERRED EMBODIMENT OF THE PRESENT INVENTION

It should be noted that in the entire specification, the same elements are designated by the same reference number.

Figure 1:
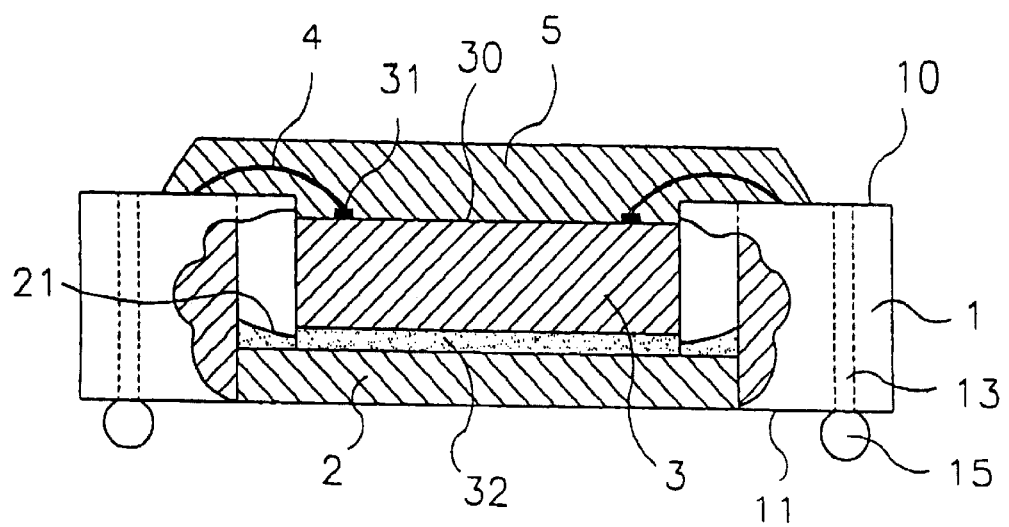
FIG. 1 shows a partial cross-sectional view of the semiconductor device according to the first embodiment of the present invention.
Figure 2:
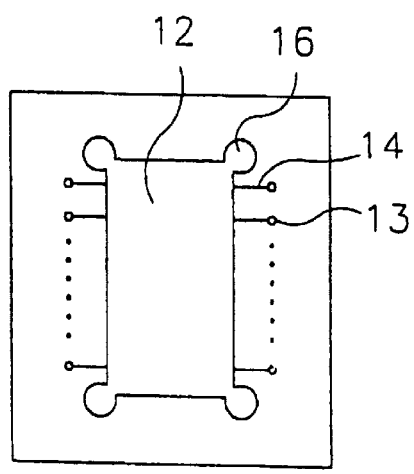
FIG. 2 shows a schematic diagram of a substrate of the first embodiment of the semiconductor device according to the present invention.

With reference to FIGS. 1 and 2, the semiconductor device according to the first embodiment of the present invention comprises: a mounting substrate 1, a supporting substrate 2, a die 3 and a plurality of electrical conductors 4.

The mounting substrate 1 comprises a first surface 10 on which a plurality of electrical traces 14 are disposed and a second surface 11 which is opposite to the first surface 10. The mounting substrate 1 is formed with a receiving hole 12 and a plurality of plated vias 13. The hole 12 and vias 13 pass through the first surface 10 and the second surface 11. The walls of the plated vias 13 are electroplated with conductive materials that is electrically connected to the corresponding electrical traces 14. The mounting substrate 1 is further provided with a plurality of conductive solder balls 15. The solder balls 15 are provided on either the surface 10 and 11 of the mounting substrate 1, aligned with a corresponding plated via 13, and electrically connected with the conductive material of the plated via 13. In the first embodiment, the receiving hole 12 is rectangular, and the mounting substrate 1 is formed with four fixing holes 16, each fixing hole 16 being located adjacent to a corner of the receiving hole 12 and communicating with the hole 12.

Figure 3:
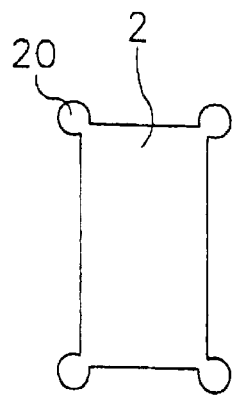
FIG. 3 shows a schematic diagram of a supporting substrate of the semiconductor device according to the first embodiment of the present invention.

The supporting substrate 2 is made of metal material, and its shape is accommodated to the receiving hole 12 and fixing holes 16 of the mounting substrate 1, shown in FIG. 3. The supporting substrate 2 is press fitted into the receiving hole 12 of the mounting substrate 1, and four corner portions 20 of the supporting substrate 2 extend to the corresponding fixing holes 16 of the mounting substrate 1 for further orientation. Thus, a die receiving cavity is formed between the wall of the receiving hole 12 of the mounting substrate 1 and the supporting substrate 2.

It should be noted that every fixing hole 16 of the mounting substrate 1 can be filled by a suitable paste material 21, such as epoxy, to prevent the supporting substrate 2 from moving relative to the mounting substrate 1.

The die 3 comprises a pad mounting surface 30 for mounting a plurality of bonding pads 31 and is received within the die receiving cavity. The die 3 is fixed by an adhesive layer 32 located between the die 3 and the supporting substrate 2.

The electrical conductors 4 are used to electrically connect the bonding pads 31 of the die 3 to the corresponding electrical traces on the first surface 10 of the mounting substrate 1. In the first embodiment, the electrical conductors 4 are conductive metal wires.

For protecting the die 3 and the electrical conductors 4, an encapsulating layer 5 used to cover the die 3 and the electrical conductors 4 can be provided on the first surface 10 of the mounting substrate 1.

It should be noted that the number of the solder balls 15 and die 3 and the arrangement of the bonding pads 31 of die 3 can be changed as desired. On the other hand, the shape of the receiving hole 12 of the mounting substrate 1 and the supporting substrate 2 are not limited to the ones shown in FIGS. 2 and 3, and any configuration created in the same technological concept can be implemented. Besides, the surface of the supporting substrate 2 which is exposed to the air may be coated with a layer of insulating material on which electrical traces (not shown) can be provided as necessary.

Figure 4:
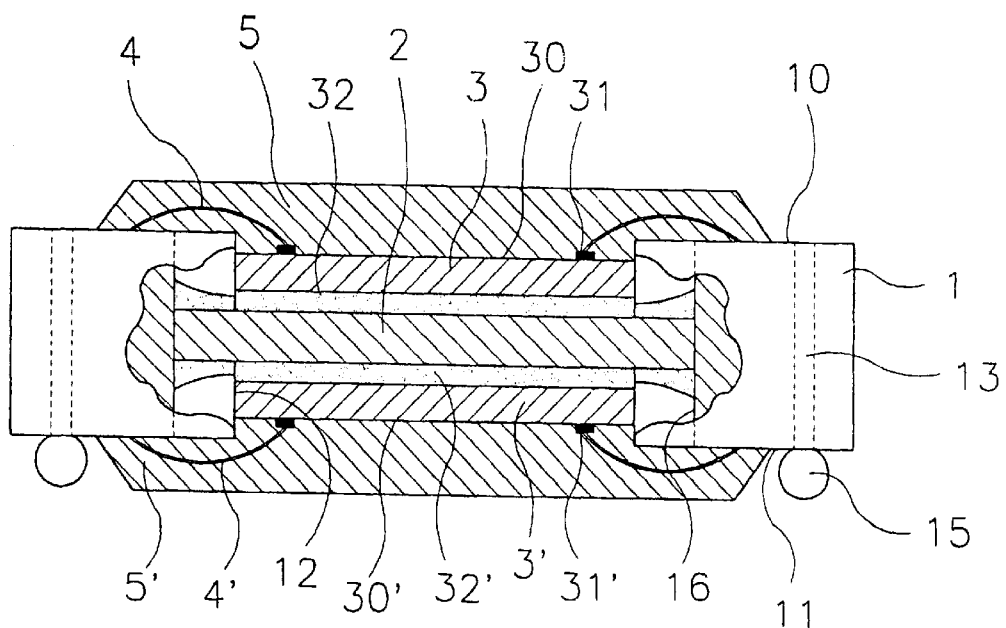
FIG. 4 shows a partial cross-sectional view of the semiconductor device according to the second embodiment of the present invention.

FIG. 4 shows a semiconductor device according to the second embodiment of the present invention. In the second embodiment, the semiconductor device comprises a mounting substrate 1, a supporting substrate 2, a first die 3, a second die 3', a plurality of first electrical conductors 4 and a plurality of second electrical conductors 4'.

The mounting substrate 1 includes the corresponding layout of the first and the second surfaces 10 and 11 for the electrical trace shown in FIG. 2, and further includes a receiving hole 12 and a plurality of plated vias 13 which pass through the first surface and the second surface 10 and 11. The wall of each plated via 13 is electroplated with conductive material that is electrically connected to the corresponding electrical trace of the mounting substrate 1. The mounting substrate 1 further includes a plurality of solder balls 15. The conductive solder balls 15 are formed on one of the surfaces 10 and 11 of the mounting substrate 1, aligned with corresponding plated vias 13, and electrically connected with the conductive material of the corresponding plated vias 13. In the second embodiment, the receiving hole 12 is rectangular, and the mounting substrate 1 is formed with four fixing holes 16, each fixing hole 16 being located adjacent to a corner of the receiving hole 12 and communicating with the hole 12.

As in the first embodiment, the supporting substrate 2 is made of metal material and the shape of the supporting substrate 2 is accommodated to the receiving hole 12 and fixing hole 16 of the mounting substrate 1. The supporting substrate 2 is press fitted within the receiving hole 12 of the mounting substrate 1, and four corner portions 20 of the supporting substrate 2 extend to the corresponding fixing holes 16 of the mounting substrate 1 for further orientation. Unlike the semiconductor device of the first embodiment, the supporting substrate 2 is received within the receiving hole 12 of the mounting substrate 1 to form a first die receiving cavity between the wall of the receiving hole 12 of the mounting substrate 1 and a surface of the supporting substrate 2 and to form a second die receiving cavity between the wall of the receiving hole 12 of the mounting substrate 1 and the opposite surface of the supporting substrate 2.

The first die 3 contains a pad mounting surface 30 for a plurality of bonding pads 31, and is disposed within the first die receiving cavity. The first die 3 is fixed by a first adhesive layer 32 provided between the first die 3 and the supporting substrate 2.

Each of the first electrical conductors 4 electrically connects a bonding 31 of the first die 3 with a corresponding electrical trace (not shown) on the first surface 10 of the mounting substrate 1.

For protecting the first die 3 and the first electrical conductors 4, an encapsulating layer 5 for covering the first die 3 and the first electrical conductors 4 is disposed on the first surface 10 of the mounting substrate 1.

The second die 3' is provided with a pad mounting surface 30' for a plurality of bonding pads 31', and is fixed by a second die receiving cavity. The second die 3' is fixed by a second adhesive layer 32' provided between the second die 3' and the supporting substrate 2.

Each of the second electrical conductors 4' electrically connects a bonding pad 31' of the second die 3' with a corresponding electrical trace (not shown) on the second surface 11 of the mounting substrate 1.

For protecting the second die 3' and the second electrical conductors 4', a second encapsulating layer 5' for covering the second die 3' and the second electrical conductors 4' is disposed on the second surface 11 of the mounting substrate 1.

As above described, although the structure of the first embodiment and the structure of the second embodiment are slightly different, the mounting substrate 1 and supporting substrate 2 of both embodiments are the same to reduce the stock cost largely.

Figure 5:
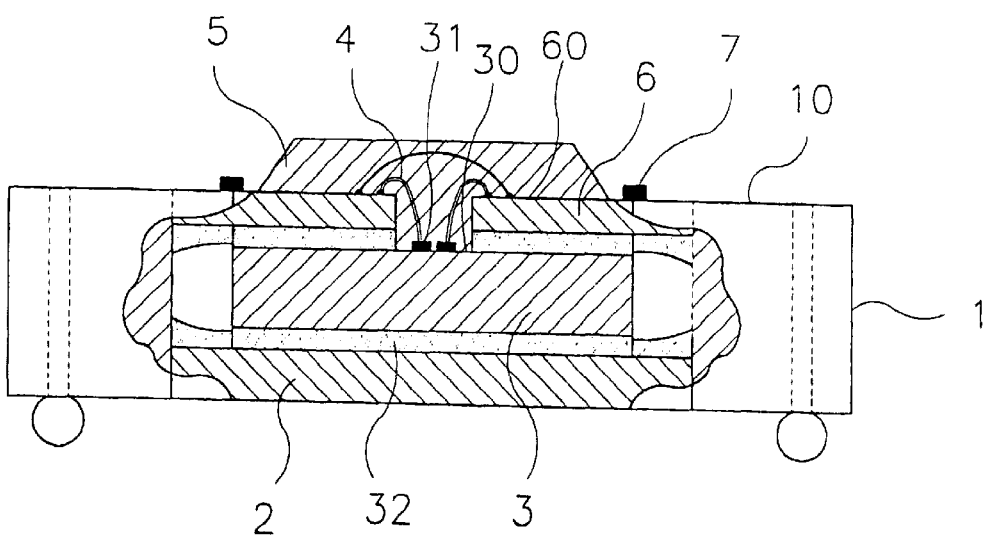
FIG. 5 shows a partial cross-sectional view of the semiconductor device according to third embodiment of the present invention.

FIG. 5 shows a semiconductor device according to the third embodiment of the present invention. The structure of the third embodiment comprises a mounting substrate 1, a supporting substrate 2, a die 3, a cover plate 6 and a plurality of electrical conductors 4.

The structures of mounting substrate 1 and supporting substrate 2 are the same with those of above two embodiments, and thus the description of the substrates 1 and 2 will be omitted hereinafter.

The die 3 includes a pad mounting surface 30 for mounting a plurality of bonding pads 31 and is disposed within the die receiving cavity. The die 3 is fixed by an adhesive layer 32 between the die 3 and the supporting substrate 2. In the third embodiment, the bonding pads 31 on the die 3 are almost disposed at the central part of the pad mounting surface 30.

Figure 6:
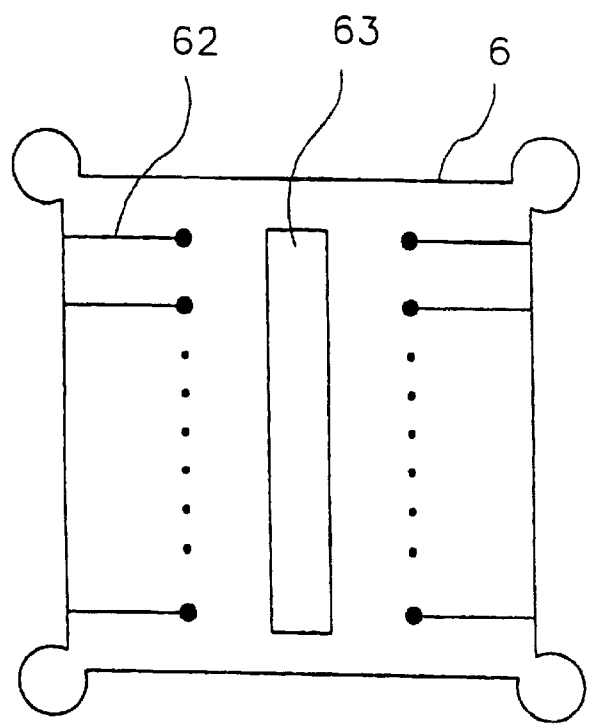
FIG. 6 shows a schematic diagram of a cover plate of the semiconductor device according to the third embodiment of the present invention.
Figure 7:
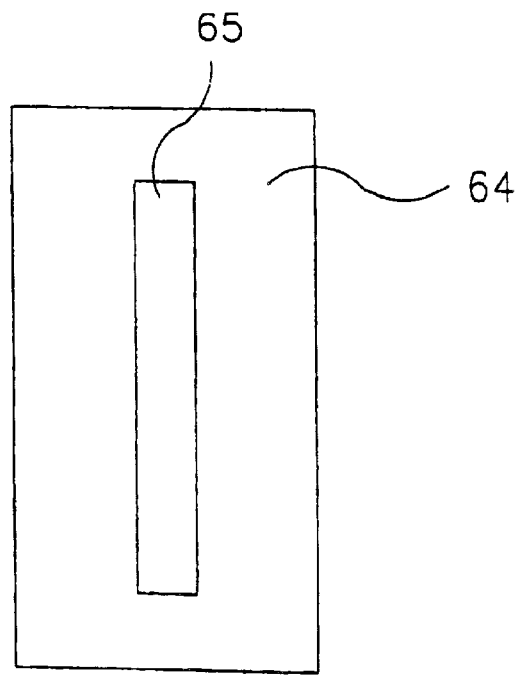
FIG. 7 shows a schematic diagram of an adhesive layer of the semiconductor device according to the third embodiment of the present invention.

In FIGS. 6 and 7, the shape of the cover plate 6 is the same with the supporting substrate 2, and the cover plate 6 is placed inside the die receiving cavity and over the die 3. Besides the press fitting, the cover plate 6 is further fixed by an adhesive layer 64 disposed between the cover plate 6 and the die 3. Both the cover plate 6 and the adhesive layer 64 comprises access openings 63 and 65 for exposing the pads 31 of the die 3. Besides, the surface 60 of the cover plate 6 exposed to the air is provided with predetermined electrical traces 62. A respective one of the electrical traces 62 of the cover plate 6 is electrically connected with a corresponding one of the electrical traces on the first surface 10 of the mounting substrate 1 by a conductive silver glue 7.

Each of the electrical conductors 4 electrically connects a bonding pad 31 of die 3 with a corresponding electrical trace 62 on the surface 60 of the cover plate 6.

For the purpose of protection, an encapsulating layer 5 for covering the cover plate 6 and the electrical conductors 4 can be provided on the first surface 10 of the mounting substrate 1.

Figure 8:
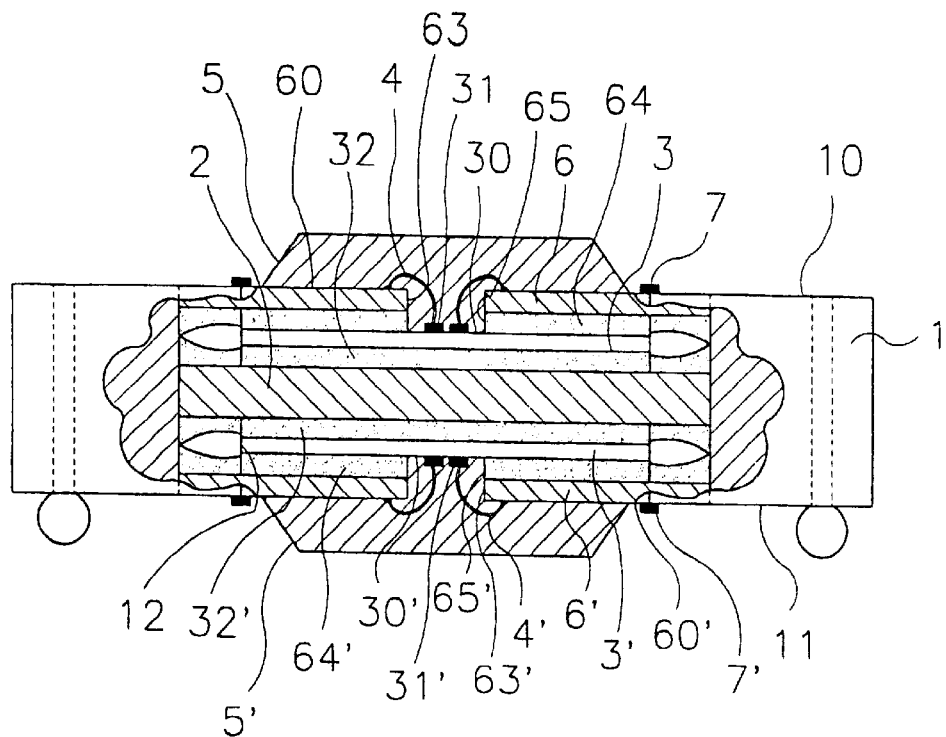
FIG. 8 shows a partial cross-sectional view of the semiconductor device according to the fourth embodiment of the present invention.

In FIG. 8, the semiconductor device according to the fourth embodiment of the present invention comprises a mounting substrate 1, a supporting substrate 2, a first die 3, a first cover plate 6, a plurality of first electrical conductors 4, a second die 3', a second cover plate 6' and a plurality of second electrical conductors 4'.

The structure of the mounting substrate 1 in the fourth embodiment is the same with the one in the second embodiment and thus its description is omitted.

The structure of the supporting substrate 2 is the same with the ones in above embodiments and thus its description is omitted. Nevertheless, it is different from substrates in the first and the third embodiment that the supporting substrate 2 is disposed within the receiving hole 12 of the mounting substrate 1 to form a first die receiving cavity between the walls of the receiving hole 12 of the mounting substrate 1 and one of the surfaces of the supporting substrate 2 and to form a second die receiving cavity between the walls of the receiving hole 12 of the mounting substrate 1 and the other surface of the supporting substrate 2.

The first die 3 includes a pad mounting surface 30 for mounting a plurality of bonding pads 31 and is placed inside the first die receiving cavity. The first die 3 is fixed by a first adhesive layer 32 between the first die 3 and the supporting substrate 2.

It is the same with the third embodiment that the first cover plate 6 is placed inside the first die receiving cavity and above the first die 3. Besides press fitting, the first cover plate 6 is fixed by an adhesive layer 64 between the first cover plate 6 and the first die 3. Both first cover plate 6 and the adhesive layer 64 comprise access openings 63 and 65 for exposing the bonding pads 31 of the die 3. Besides, the surface 60 of the first cover plate 6 exposed to the air is provided with predetermined electrical traces (not shown) as the previous embodiment. A respective one of the electrical traces of the first cover plate 6 is electrically connected to a corresponding one of the electrical traces of the first surface 10 of the mounting substrate 1 through a conductive silver glue 7.

The first electrical conductors 4 respectively electrical connect the bonding pads 31 of the first die 3 with the corresponding electrical traces on the surface 60 of the first cover plate 6.

For protection of the first cover plate 6 and the first electrical conductors 4, a first encapsulating layer 5 for covering the first cover plate 6 and the first electrical conductors 4 is disposed on the first surface 10 of the mounting substrate 1.

The second die 3' includes a pad mounting surface 30' for mounting a plurality of bonding pads 31' and is placed inside the second die receiving cavity. The second die 3' is fixed by a second adhesive layer 32' between the second die 3' and the supporting substrate 2.

It is the same with the second cover plate 6 that the second cover plate 6' is placed inside the second die receiving cavity and above the second die 3'. Besides the press fitting, the second cover plate 6' is fixed by an adhesive layer 64' between the second cover plate 6' and the second die 3'. Both second cover plate 6' and the adhesive layer 64' have access openings 63' and 65' for exposing the bonding pads 31' of the second die 3'. Besides, the surface 60' of the second cover plate 6' exposed to the air is provided with predetermined electrical traces (not shown). The electrical traces of the second cover plate 6' are respectively electrically connected with the corresponding electrical traces on the second surface 11 of the mounting substrate 1 through the conductive silver glue 7' crossing from the surface 60' of the second cover plate 6' to the first surface 10 of the mounting substrate 1.

The second electrical conductors 4' are respectively electrically connect the bonding pads 31' of the second die 3' with the corresponding electrical traces on the surface 60' of the second cover plate 6'.

Figure 9:
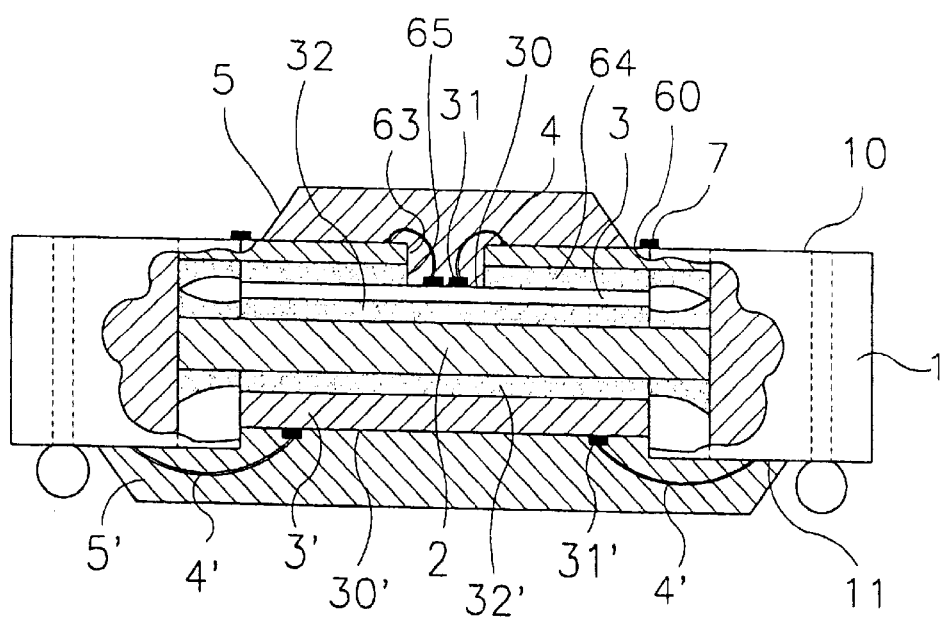
FIG. 9 shows a partial cross-sectional view of the semiconductor device according to the fifth embodiment of the present invention.

For protection of the second cover plate 6' and the second electrical conductors 4', a second encapsulating layer 5' for covering the second cover plate 6' and the second electrical conductors 4' is disposed on the second surface 11 of the mounting substrate 1. In FIG. 9, the semiconductor device according to the fifth embodiment of the present invention comprises a mounting substrate 1, a supporting substrate 2, a first die 3, a cover plate 6, a plurality of first electrical conductors 4, a second die 3' and a plurality of second electrical conductors 4'.

The structure of the mounting substrate 1 and the supporting substrate 2 is the same with the ones in the second and fourth embodiments and thus its description is omitted.

The first die 3 includes a pad mounting surface 30 for mounting a plurality of bonding pads 31 and is received in the first die receiving cavity.

The first die 3 is fixed by a first adhesive layer 32 between the first die 3 and the supporting substrate 2.

It is the same with the third and fourth embodiments that the first cover plate 6 is received in the first die receiving cavity over the first die 3. Besides press fitting, the first cover plate 6 is fixed by an adhesive layer 64 disposed between the first cover plate 6 and the first die 3. Both the first cover plate 6 and the adhesive layer 64 comprise access openings 63 and 65 for exposing the pads 31 of the die 3. Besides, the surface 60 of the first cover substrate 6 exposed to the air is provided with predetermined electrical traces. A respective one of the electrical traces of the first cover plate 6 is electrically connected with a corresponding one of the electrical traces of the first surface 10 of the mounting substrate 1 through the conductive silver glue 7.

The first electrical conductors 4 are respectively electrically connect the bonding pads 31 of the first die 3 with the corresponding electrical traces on the surface 60 of the first cover plate 6.

For protection of the first cover plate 6 and the first electrical conductors 4, an encapsulating layer 5 for covering the first cover plate 6 and the first electrical conductors 4 is disposed on the first surface 10 of the mounting substrate 1.

The second die 3' includes a pad mounting surface 30' for mounting a plurality of bonding pad 31' and is received in the second die receiving cavity. The second die 3' is fixed by a second adhesive layer 32' disposed between the second die 3' and the supporting substrate 2.

The second electrical conductors 4' are respectively electrically connect the bonding pads 31' of the second die 3' with the corresponding electrical traces on the second surface 11 of the mounting substrate 1.

For protection of the second die 3' and the second electrical conductors 4', a second encapsulating layer 5' for covering the second die 3' and the second electrical conductors 4' is disposed on the second surface 11 of the mounting substrate 1.

As above described, the semiconductor device according to the present invention can achieve the desired objects and effects by the above disclosed structures and apparatus, and the present invention is not disclosed in publications and is never put into the public use. Thus, the present invention meets the novelty and invention step requirements.

The above-described embodiments of the invention are intended to be illustrated only. Numerous alternative embodiments may be devised by those skilled in the art without departing from the scope of the following claims.

What is claimed is:

1. A semiconductor device, comprising:
    a mounting substrate including a first surface on which predetermined electrical traces are disposed and a second surface opposite to said first surface, said mounting substrate formed in a shape with corners with a fixing hole at each corner, said fixing hole communicating with the receiving hole,
    a supporting substrate being made of a metal material and having a shape that corresponds to the shape of said receiving hole of said mounting substrate and fits therein, said supporting substrate received in said receiving hole of said mounting substrate to form at least one die receiving cavity between peripheral wall confining said receiving hole of said mounting substrate and said supporting substrate;
    a die including a pad mounting surface provided with a plurality of bonding pads and being received in said die receiving cavity;
    a plurality of electrical connectors for electrically connecting said bonding pads of said die with corresponding said electrical trances on said first surface of said mounting substrate.

2. The semiconductor device of claim 1, wherein said first surface of said mounting substrate is provided with a plurality of solder balls, and said solder balls are electrically connected with corresponding said electrical traces on said first surface of said mounting substrate.

3. The semiconductor device of claim 1, wherein said mounting substrate is formed with a plurality of plated vias each being confined by a peripheral wall that is electroplated with conductive material electrically connected with corresponding said electrical traces on said mounting substrate, and has a plurality of solder balls which are disposed on one of said first surface and said second surface of said mounting substrate, aligned with corresponding said plated vias and electrically connected with the conductive material of corresponding said plated vias.

4. The semiconductor device of claim 1, wherein said receiving hole of said mounting substrate is rectangular with a fixing hole at each of the corners communicating with the receiving hole and wherein the shape of the supporting substrate corresponds to the shape of said receiving hole to fit into said receiving hole.

5. The semiconductor device of claim 1, further comprising an encapsulated layer disposed on said first surface of said mounting substrate for covering said die and said electrical conductors.

6. The semiconductor device of claim 1, further comprising an adhesive layer which is located between said die and said supporting substrate.

7. The semiconductor device of claim 1, wherein said supporting substrate has a surface which is exposed to the air and which is provided with a layer of insulating material, said insulating layer being provided with electrical traces thereon.

8. The semiconductor device of claim 1, wherein said second surface of said mounting substrate is provided with predetermined electrical traces, and said supporting substrate is received in said receiving hole of said mounting substrate to form a first die receiving cavity between said peripheral wall of said receiving hole of said mounting substrate and one of the surfaces of said supporting substrate for receiving said die, and to form a second die receiving cavity between said peripheral wall of said receiving hole of said mounting substrate and the other one of the surfaces of said supporting substrate, said semiconductor device further comprising:
    a second die including a pad mounting surface provided with a plurality of bonding pads and being received in said second die receiving cavity; and
    a plurality of second electrical conductors for electrically connecting said bonding pads of said second die with corresponding said electrical traces on said second surface of said mounting substrate.

9. The semiconductor device of claim 1, wherein said electrical conductors are conductive metal wires.

10. The semiconductor device of claim 4, wherein said fixing holes of said mounting substrate are filled with paste material to prevent said supporting substrate from moving relative to said mounting substrate.

11. The semiconductor device of claim 8, further comprising an encapsulating layer disposed on said second surface of said mounting substrate for covering said second die and said second electrical conductors.

12. The semiconductor device of claim 8, wherein said second electrical conductors are conductive metal wires.

13. A semiconductor device, comprising:
    a mounting substrate including a first surface provided with predetermined electrical traces thereon and a second surface opposite to said first surface, said mounting substrate formed with a receiving hole passing through said first surface and said second surface;
    a supporting substrate being made of metal material and having a shape that is accommodated to said receiving hole of said mounting substrate, said supporting substrate received in said receiving hole of said mounting substrate to form at least one die receiving cavity between peripheral wall confining said receiving hole of said mounting substrate and said supporting substrate;
    a die including a pad mounting surface for mounting a plurality of bonding pads and being received in said die receiving cavity;
    a cover plate having a shape accommodated to said supporting substrate and being received in said die receiving cavity over said die, said cover plate being formed with at least one access opening for exposing said pads of said die, said cover plate having a surface which is exposed to the air and which is provided with predetermined electrical traces that are electrically connected with corresponding said electrical traces on said first surface of said mounting substrate; and a plurality of electrical conductors for electrically connecting said pads of said die with corresponding said electrical traces on said surface of said cover plate.

14. The semiconductor device of claim 13, further comprising an encapsulating layer disposed on said first surface of said mounting substrate for covering said cover plate and said electrical conductors.

15. The semiconductor device of claim 13, wherein said mounting substrate has a plurality of solder balls provided on said first surface thereof, said solder balls being electrically connected with corresponding said electrical traces on said first surface of said mounting substrate.

16. The semiconductor device of claim 13, wherein said mounting substrate is formed with a plurality of plated vias each being confined by a peripheral wall which is electroplated with conductive material that is electrically connected to corresponding said electrical traces of said mounting substrate, and has a plurality of solder balls which are disposed on one of said first surface and said second surface of said mounting substrate and which are aligned with corresponding said plated vias, said solder balls being electrically connected with the conductive material of corresponding said plated vias.

17. The semiconductor device of claim 13, wherein said receiving hole of said mounting substrate is rectangular and said mounting substrate are provided with a plurality of fixing holes each being located adjacent to a corner of said receiving hole and being communicated with said receiving hole, said supporting substrate having four corner portions which extend into corresponding said fixing holes of said mounting substrate.

18. The semiconductor device of claim 13, wherein said fixing holes of said mounting substrate are filled with paste material to prevent said supporting substrate from moving relative to said mounting substrate.

19. The semiconductor device of claim 13, further comprising an adhesive layer between said die and said supporting substrate.

20. The semiconductor device of claim 13, wherein said supporting substrate has a surface which is exposed to the air and which is provided with a layer of insulating material, said insulating layer being provided with electrical traces thereon.

21. The semiconductor device of claim 13, further comprising an adhesive layer which is located between said cover plate and said die and which is formed with at least one access opening corresponding to said access opening of said cover plate.

22. The semiconductor device of claim 13, wherein said second surface of said mounting substrate is provided with predetermined electrical traces, and said supporting substrate is received in said receiving hole of said mounting substrate to form a first die receiving cavity between said peripheral walls of said receiving hole of said mounting substrate and one of the surfaces of said supporting substrate for receiving said die, and to form a second die receiving cavity between said peripheral wall of said receiving hole of said mounting substrate and the other surface of said supporting substrate, said semiconductor device further comprising:

a second die including a pad mounting surface provided with a plurality of bonding pads and being received in said second die receiving cavity;

a second cover plate received in said second die receiving cavity over said second die, said second cover plate being formed with at least one access opening for exposing said pads of said second die, said cover plate having a surface which is exposed to the air and which is provided with predetermined electrical traces that electrically connected with corresponding said electrical traces on said second surface of said mounting substrate; and a plurality of second electrical conductors for electrically connecting said pads of said second die with corresponding said electrical traces on the second surface of said mounting substrate.

23. The semiconductor device of claim 13, wherein said electrical conductors are conductive metal wires.

24. The semiconductor device of claim 13, wherein said second surface of said mounting substrate is provided with predetermined electrical traces, and said supporting substrate is received in said receiving hole of said mounting substrate to form a first die receiving cavity between said peripheral wall of said receiving hole of said mounting substrate and one of the surfaces of said supporting substrate for said die and to form a second die receiving cavity between said peripheral wall of said receiving hole of said substrate and the other surface of said supporting substrate, said semiconductor device further comprising:

a second die having a pad mounting surface for mounting a plurality of bonding pads and being received in said second die receiving cavity; and a plurality of second electrical conductors for electrically connecting said pads of said second die with corresponding said electrical traces on said second surface of said mounting substrate.

25. The semiconductor device of claim 13, further comprising a conductive silver glue which crosses a respective one of said electrical traces of said cover plate to a corresponding one of said electrical traces on said first surface of said mounting substrate.

26. The semiconductor device of claim 22, further comprising an encapsulating layer disposed on said second surface of said mounting substrate for covering said second cover plate and said electrical conductors.

27. The semiconductor device of claim 22, wherein said second electrical conductors are conductive metal wires.

28. The semiconductor device of claim 22, further comprising an adhesive layer disposed between said second cover plate and said second die, said adhesive layer being formed with at least one access opening corresponding to said access opening of said second cover plate.

29. The semiconductor device of claim 22, further comprising a conductive silver glue which crosses a respective one of said electrical traces of said cover plate to a corresponding one of said electrical traces on said second surface of said mounting substrate.

30. The semiconductor device of claim 24, further comprising an encapsulated layer disposed on said second surface of said mounting substrate for covering said second die and said second electrical conductors.

31. The semiconductor device of claim 24, wherein said second electrical conductors are conductive metal wires.

* * * * *